(12) United States Patent
Kim et al.

(10) Patent No.: US 10,726,887 B2
(45) Date of Patent: Jul. 28, 2020

(54) MEMORY DEVICE AND OPERATING METHOD OF THE MEMORY DEVICE

(71) Applicant: SK hynix Inc., Icheon-si, Gyeonggi-do (KR)

(72) Inventors: Jong Wook Kim, Cheongju-si (KR); Tae Un Youn, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/288,514

(22) Filed: Feb. 28, 2019

(65) Prior Publication Data

US 2020/0043533 A1 Feb. 6, 2020

(30) Foreign Application Priority Data

Jul. 31, 2018 (KR) .................. 10-2018-0089614

(51) Int. Cl.
*G11C 16/06* (2006.01)
*G11C 7/14* (2006.01)
*G06F 12/02* (2006.01)
*G11C 16/10* (2006.01)

(52) U.S. Cl.
CPC ............ *G11C 7/14* (2013.01); *G06F 12/0207* (2013.01); *G11C 16/10* (2013.01)

(58) Field of Classification Search
CPC ........ G11C 7/14; G11C 16/10; G06F 12/0207
USPC ..................................... 365/185.21
See application file for complete search history.

(56) References Cited

U.S. PATENT DOCUMENTS

| 2012/0201071 | A1* | 8/2012 | Ukai | G11C 5/025 |
| | | | | 365/149 |
| 2015/0332770 | A1* | 11/2015 | Kim | G11C 16/0483 |
| | | | | 365/185.12 |
| 2015/0332772 | A1* | 11/2015 | Kim | G11C 16/10 |
| | | | | 365/185.22 |

FOREIGN PATENT DOCUMENTS

| KR | 1020110092550 A | 8/2011 |
| KR | 1020120090867 A | 8/2012 |
| KR | 1020150062434 A | 6/2015 |

* cited by examiner

*Primary Examiner* — Huan Hoang
(74) *Attorney, Agent, or Firm* — William Park & Associates Ltd.

(57) ABSTRACT

A memory device includes a memory cell array and a peripheral circuit. The memory cell array includes a plurality of memory blocks. The peripheral circuit performs a dummy operation on a dummy area among the plurality of memory blocks of the memory cell array.

15 Claims, 8 Drawing Sheets

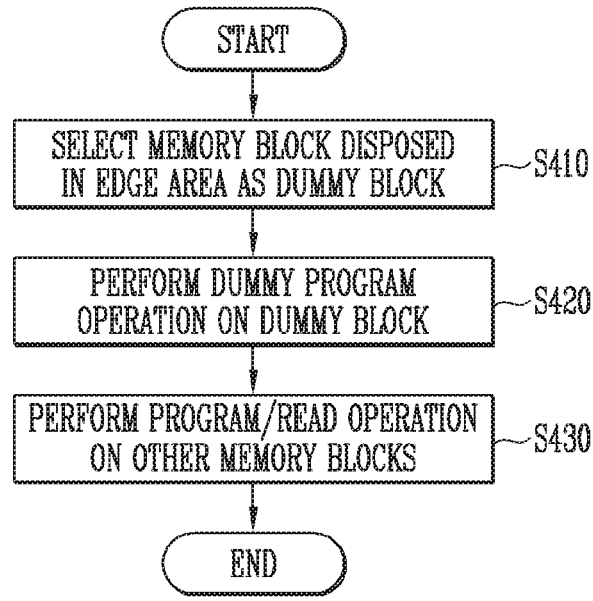
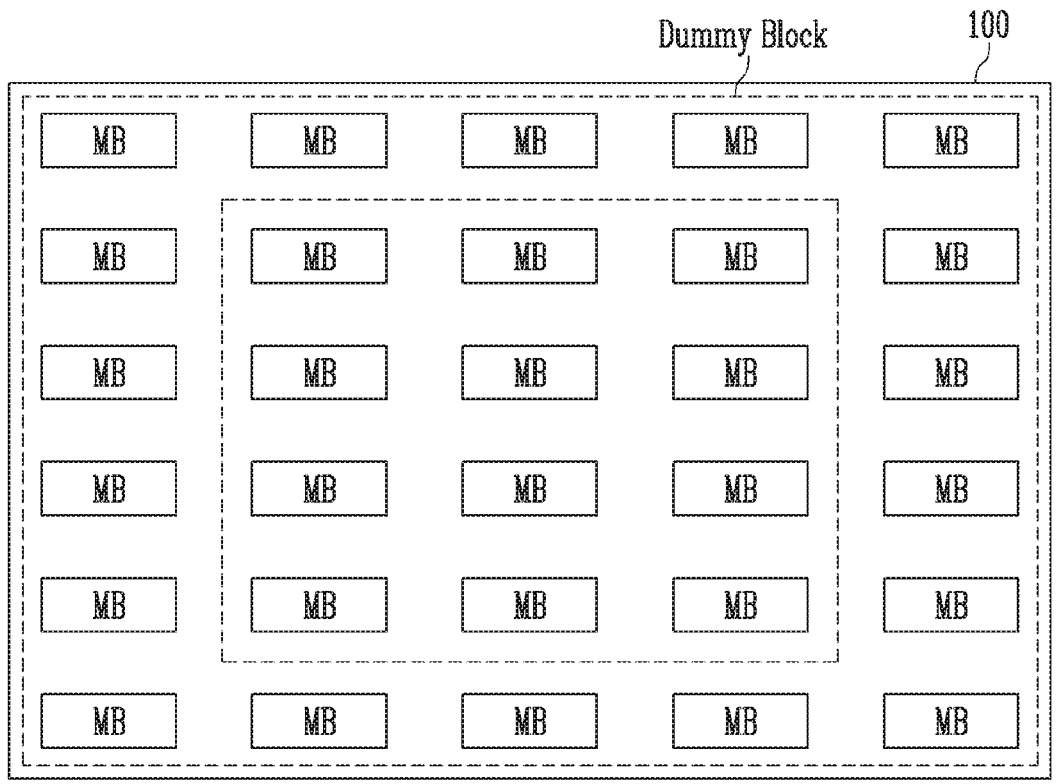

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2018-0089614, filed on Jul. 31, 2018, in the Korean Intellectual Property Office, the entire disclosure of which is incorporated herein by reference.

BACKGROUND

1. Technical Field

Various embodiments of the present disclosure generally relate to an electronic device, and more particularly, to a memory device and an operating method of the memory device.

2. Related Art

The paradigm for the recent computer environment has been turned into ubiquitous computing in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device may be used as a main memory device or an auxiliary memory device of the portable electronic devices.

A data storage device using a memory device may have excellent stability and durability, high information access speed, and low power consumption, since there is no mechanical driving part. In an example of memory systems having such advantages, the data storage device may include a Universal Serial Bus (USB) memory device, memory cards having various interfaces, a Solid State Drive (SSD), and the like.

The memory device may generally be classified into a volatile memory device and a nonvolatile memory device.

The nonvolatile memory device may have relatively slow write and read speeds, but retains stored data even when the supply of power is interrupted. Thus, the nonvolatile memory device may be used to store data to be retained regardless of whether power is supplied.

Examples of the volatile memory may include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory may be classified into a NOR type flash memory and a NAND type flash memory.

SUMMARY

According to an aspect of the present disclosure, there may be provided a memory device including: a memory cell array including a plurality of memory blocks; and a peripheral circuit configured to perform a dummy program operation on dummy blocks among the plurality of memory blocks of the memory cell array. The peripheral circuit may program dummy data in the dummy blocks in the dummy program operation.

According to an aspect of the present disclosure, there may be provided a memory device including: a memory cell array including a plurality of memory blocks; and a peripheral circuit configured to perform a dummy program operation on a dummy area defined by edge pages and edge memory strings among the plurality of memory blocks of the memory cell array.

According to an aspect of the present disclosure, there may be provided a method for operating a memory device, the method including: providing a memory device including a plurality of memory blocks; selecting memory blocks disposed at an outermost portion among the plurality of memory blocks as dummy blocks; and performing a dummy program operation on the dummy blocks.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 4 is a flowchart illustrating an operating method of the memory device according to an embodiment of the present disclosure.

FIG. 5 is a diagram illustrating an embodiment of a memory cell array of FIG. 2.

DETAILED DESCRIPTION

Figure 1:
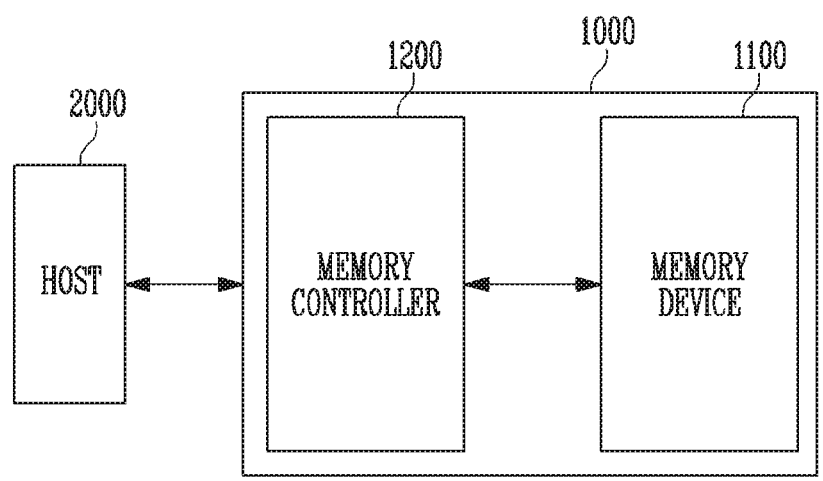
FIG. 1 is a diagram illustrating a memory system according to an embodiment of the present disclosure.

Embodiments according to the concept of the present disclosure can be variously modified and have various shapes. Thus, embodiments are illustrated in the drawings and are intended to be described herein in detail. However, embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Embodiments of the present disclosure may provide a memory device capable of preventing degradation of retention characteristics due to mobile ions, using memory blocks disposed at an outer edge of a memory cell array as a dummy block, and an operating system of the memory device.

FIG. 1 is a diagram illustrating a memory system according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host 2000 and the memory system 1000 are not limited to the above-described examples, and may be one of other interface protocols such as a Universal Serial Bus (USB), a Multi-Media Card (MMC), an Enhanced Small Disk Interface (ESDI), and Integrated Drive Electronics (IDE).

The memory controller 1200 may control the overall operations of the memory system 1000, and control data exchange between the host 2000 and the memory device 1100. For example, the memory controller 1200 may program or read data by controlling the memory device 1100 in response to a request from the host 2000. In some embodiments, the memory device 1100 may include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), and a flash memory.

The memory device 1100 may perform a program, read, or erase operation under the control of the memory controller 1200.

Figure 2:
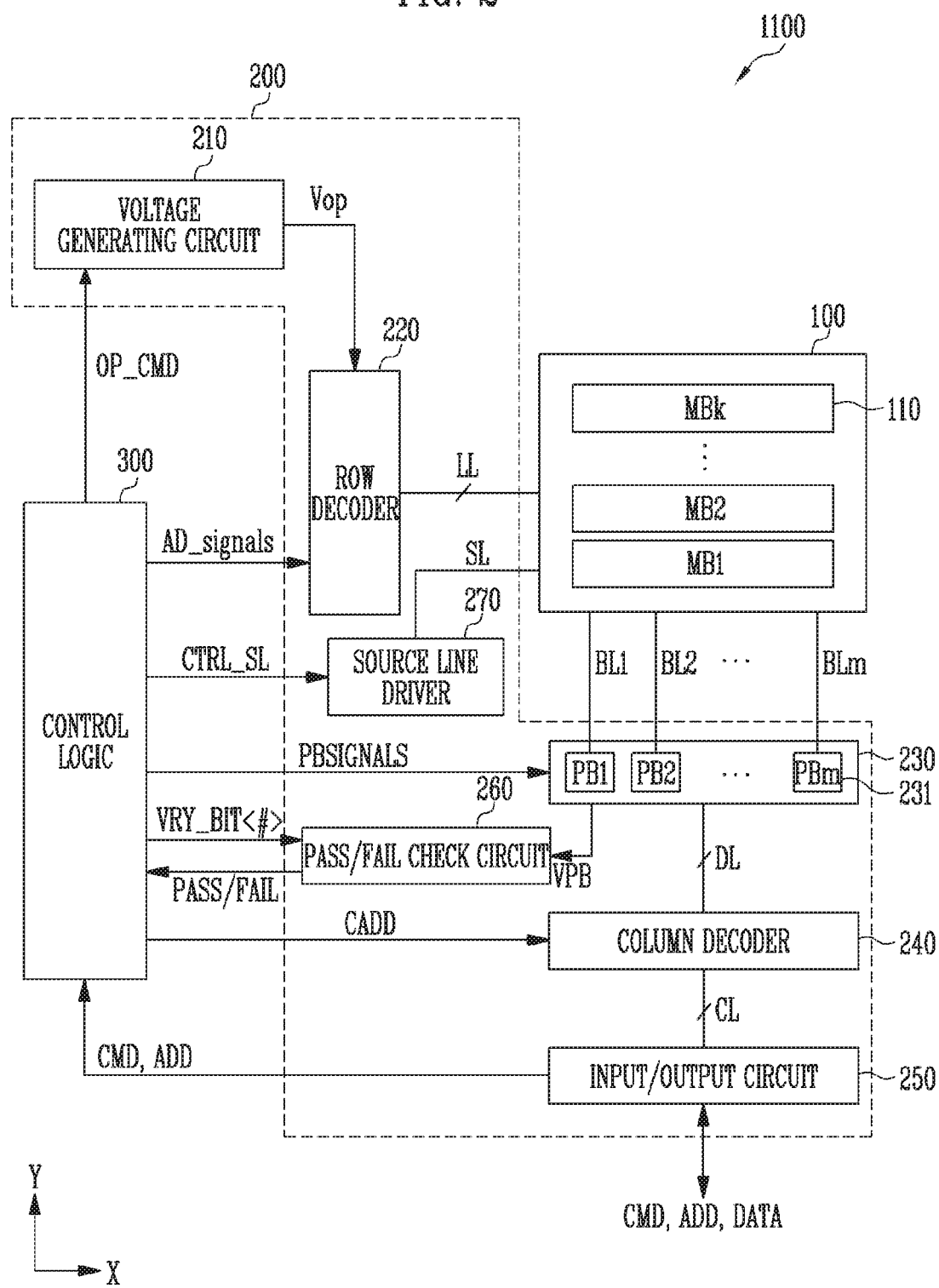
FIG. 2 is a diagram illustrating a memory device of FIG. 1.

FIG. 2 is a diagram illustrating the memory device of FIG. 1.

Referring to FIG. 2, the memory device 1100 may include a memory cell array 100 that stores data. The memory device 1100 may include a peripheral circuit 200 configured to perform a program operation for storing data in the memory cell array 100, a read operation for outputting the stored data, and an erase operation for erasing the stored data. The memory device 1100 may include a control logic 300 that controls the peripheral circuit 200 under the control of the memory controller 1200 of FIG. 1.

The memory cell array 100 may include a plurality of memory blocks MB1 to MBk (k is a positive integer) 110. Local lines LL and bit lines BL1 to BLm (m is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLm may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuit 200 may be configured to perform program, read, and erase operations of a selected memory block 110 under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, a pass voltage, and the like under the control of the control logic 300.

The row decoder 220 may transfer the operating voltages Vop to local lines LL coupled to the selected memory block 110 in response to row decoder control signals AD_signals. For example, the row decoder 220 may selectively apply operation voltages (e.g., a program voltage, a verify voltage, a pass voltage, and the like) generated by the voltage generating circuit 210 to word lines among the local lines LL in response to the row decoder control signals AD_signals.

The page buffer group 230 may include a plurality of page buffers PB1 to PBn 231 coupled to the bit lines BL1 to BLm.

The page buffers PB1 to PBn 231 may operate in response to page buffer control signals PBSIGNALS. For example, the page buffers PB1 to PBn 231 may temporarily store data received through the bit lines BL1 to BLm, or sense voltages or current of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the memory controller 1200 of FIG. 1, to the control logic 300, or exchange data DATA with the column decoder 240.

In a read operation and a verify operation, the pass/fail check circuit 260 may generate a reference current in response to a allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 100 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuit 200 by outputting the operation signal OP_CMD, the row decoder control signals AD_signals, the page buffer control signals PBSIGNALS, and the allow bit VRY_BIT<#> in response to the command CMD and the address ADD. Also, the control logic 300 may determine whether the verify operation has passed or failed in response to the pass or fail signal PASS or FAIL.

As described above, in the memory device 1100 according to an embodiment of the present disclosure, memory blocks (e.g., MB1 and MBk) disposed in an edge area (e.g., outermost area) among the plurality of memory blocks MB1 to MBk 110 included in the memory cell array 100 may be defined as a dummy block, and the peripheral circuit 200 may perform a dummy program operation of programming dummy data in the dummy block. The plurality of memory blocks MB1 to MBk included in the memory cell array 100 may be sequentially disposed in one direction, and a memory block disposed firstly and a memory block MBk disposed lastly may be defined as a dummy block. The dummy program operation may be an operation of programming memory cells included in the dummy block (e.g., MB1 and MBk) to have a negative polarity. For example, the dummy program operation may be an operation of programming the memory cells to have a threshold voltage higher than 0 volts (V).

In an embodiment of the present disclosure, the memory device 100 may perform a dummy program operation of programming dummy data in edge pages of memory blocks (e.g., MB1 and MBk) disposed in an edge area among the plurality of memory blocks MB1 to MBk 110 included in the memory cell array 100 and edge memory strings of the plurality of memory blocks MB1 to MBk 110.

Figure 3:
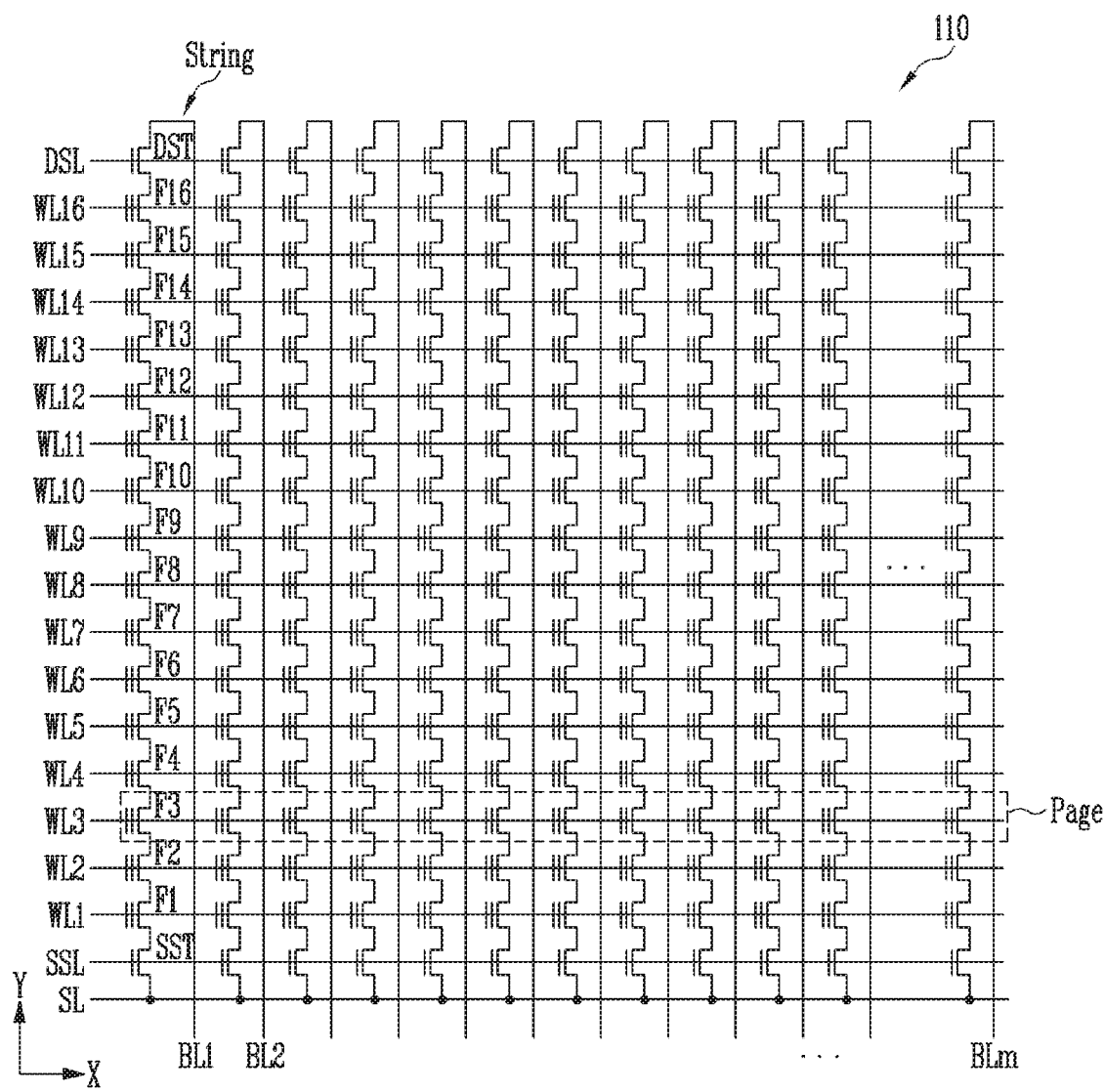
FIG. 3 is a diagram illustrating a memory block of FIG. 2.

FIG. 3 is a diagram illustrating the memory block of FIG. 2.

Referring to FIG. 3, in the memory block 110, a plurality of word lines arranged in parallel to one another may be coupled between a first select line and a second select line.

The first select line may be a source select line SSL, and the second select line may be a drain select line DSL. More specifically, the memory block 110 may include a plurality of memory strings String coupled between bit lines BL1 to BLm and a source line SL. The bit lines BL1 to BLm may be coupled to the memory strings String, respectively, and the source line SL may be commonly coupled to the memory strings String. The memory strings String may be configured identically to one another, and therefore, a memory string String coupled to a first bit line BL1 will be described in detail as an example.

The memory string String may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one memory string String, and memory cells of which number is greater than that of the memory cells F1 to F16 illustrated in the drawing may be included in one memory string String.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different memory strings String may be coupled to the source select line SSL, gates of drain select transistors DST included in different memory strings String may be coupled to the drain select line DSL, gates of the memory cells F1 to F16 included in different memory strings String may be coupled to a plurality of word lines WL1 to WL16. A group of memory cells coupled to the same word line among the memory cells included in different memory strings ST may be a page Page. Therefore, pages Page of which number corresponds to that of the word lines WL1 to WL16 may be included in the memory block 110.

FIG. 4 is a flowchart illustrating an operating method of the memory device according to an embodiment of the present disclosure.

The operating method of the memory device according to an embodiment of the present disclosure will be described as follows with reference to FIGS. 1 to 4.

Memory blocks (e.g., MB1 and MBk) disposed in an edge area (e.g., outermost portion) among the plurality of memory blocks MB1 to MBk 110 included in the memory cell array 100 may be selected as a dummy block (S410). The operation of selecting the memory blocks MB1 and MBk disposed in the edge area as the dummy block may be performed under the control of the memory controller 1200 or be performed by the control logic 300 of the memory device 1100.

The memory device 1100 may perform a dummy program operation on the memory blocks (e.g., MB1 and MBk) selected as the dummy block (S420). The dummy program operation may be an operation of programming the same dummy data in memory cells included in the dummy block. For example, the dummy program operation may be an operation of programming the memory cells to have a threshold voltage higher than 0 volts (V). The dummy program operation may be performed by sequentially selecting the selected memory blocks (e.g., MB1 and MBk). The dummy program operation may be an operation of programming the same dummy data in all the memory cells included in the selected memory blocks (e.g., MB1 to MBk). The dummy program operation might not be performed in units of pages but may be performed in units of blocks.

Operations of the peripheral circuit 200 in the dummy program operation will be described as follows.

1) Bit Line Potential Control Operation

The plurality of page buffers PB1 to PBm 231 coupled to the bit lines BL1 to BLm in page buffer group 230 may control the bit lines BL1 to BLm to have a potential level corresponding to the dummy data in response to the page buffer control signals PBSIGNALS. For example, the plurality of page buffers PB1 to PBm 231 may apply a program allow voltage (e.g., a ground voltage) to the bit lines BL1 to BLm, 2) Program Voltage Application Operation The voltage generating circuit 210 may generate a program voltage in response to an operation signal OP_CMD.

The row decoder 220 may apply the program voltage generated by the voltage generating circuit 210 to all word lines of the selected memory block (e.g., MB1) in the dummy block in response to the row decoder control signals AD_signals. Therefore, memory cells included in the selected memory block MB1 may be simultaneously programmed.

3) Program Verify Operation

Subsequently, the voltage generating circuit 210 may generate and output a verify voltage in response to the operation signal OP_CMD, and may apply the verify voltage generated by the voltage generating circuit 210 to all word lines of the selected memory block (e.g., MB1) in response to the row decoder control signals AD_signals.

The plurality of page buffers PB1 to PBm coupled to the bit lines BL1 to BLm may simultaneously perform program verify on a plurality memory cells coupled to each of the bit lines BL1 to BLm by sensing potential levels of the bit lines BL1 to BLm in response to the page buffer control signals PBSIGNALS. For example, when at least one memory cell among a plurality of memory cells included in one memory string String has a threshold voltage lower than the verify voltage, the memory string String may be determined as a program fail.

When at least one memory string String is determined as the program fail, the operations may be re-performed from the above-described bit line potential control operation, and a program voltage increased by a step voltage may be applied in the program voltage application operation.

After the dummy program operation on the dummy block is performed in the manner that performs the program operation in units of blocks, a general operation such as a program operation or read operation may be performed on the other memory blocks (S430).

As described above, according to an embodiment of the present disclosure, the dummy data may be programmed in the memory blocks (e.g., MB1 and MBk) disposed in the edge area of the memory cell array 100, so that charges in the memory cells included in the memory blocks (e.g., MB1 and MBk) are charged to have a negative polarity. Thus, although mobile ions (e.g., $Na^+$) generated in the peripheral circuit 200 are moved close to the memory cell array 100 due to heat generated in a subsequent general operation, the mobile ions may be gathered to the memory blocks (e.g., MB1 and MBk) disposed in the edge area. Accordingly, retention characteristics of the other memory blocks except the dummy block can be prevented from being degraded by the mobile ions (e.g., $Na^+$) generated in the peripheral circuit 200.

Mobile ions may be gathered in the memory blocks (e.g., MB1 and MBk) disposed in the edge area, in which the dummy data is programmed, and hence the threshold voltage distribution of memory cells may be reduced. Therefore, the memory blocks (e.g., MB1 and MBk) disposed in the edge area may be reprogrammed by re-performing the step S420 after a certain time from when the step S430 is performed or after a program/read operation is performed a certain number of times.

FIG. 5 is a diagram illustrating an embodiment of the memory cell array of FIG. 2.

Referring to FIG. 5, the memory cell array 100 may include a plurality of memory blocks MB, and the plurality of memory blocks MB may be arranged in a matrix structure. Therefore, memory blocks MB disposed in the edge area of the memory cell array 100 may be selected as a dummy block Dummy Block. When the plurality of memory blocks MB are arranged in the matrix structure, the dummy block Dummy Block may be selected to include memory blocks disposed in all edge areas of the memory cell array 100. For example, the dummy block Dummy Block may include memory blocks disposed at an outermost portion among the plurality of memory blocks MB arranged in the matrix structure. Thus, retention characteristics of the other memory blocks MB except the dummy block Dummy Block can be more effectively prevented from being degraded by mobile ions.

Figure 6:
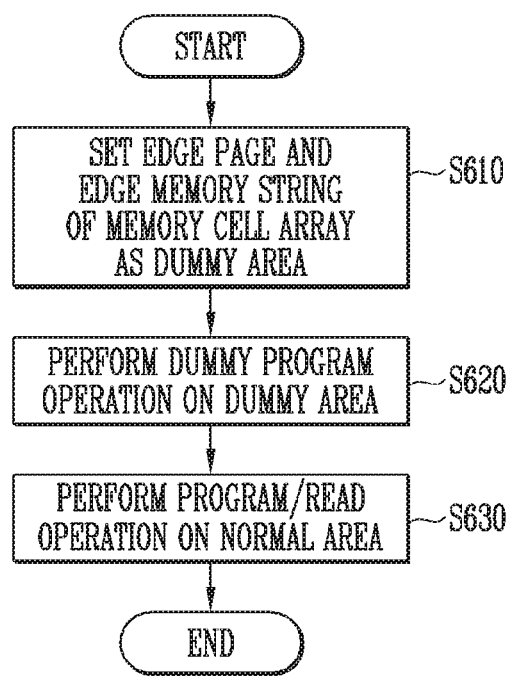
FIG. 6 is a flowchart illustrating an operating method of the memory device according to an embodiment of the present disclosure.

FIG. 6 is a flowchart illustrating an operating method of the memory device according to an embodiment of the present disclosure.

Figure 7:
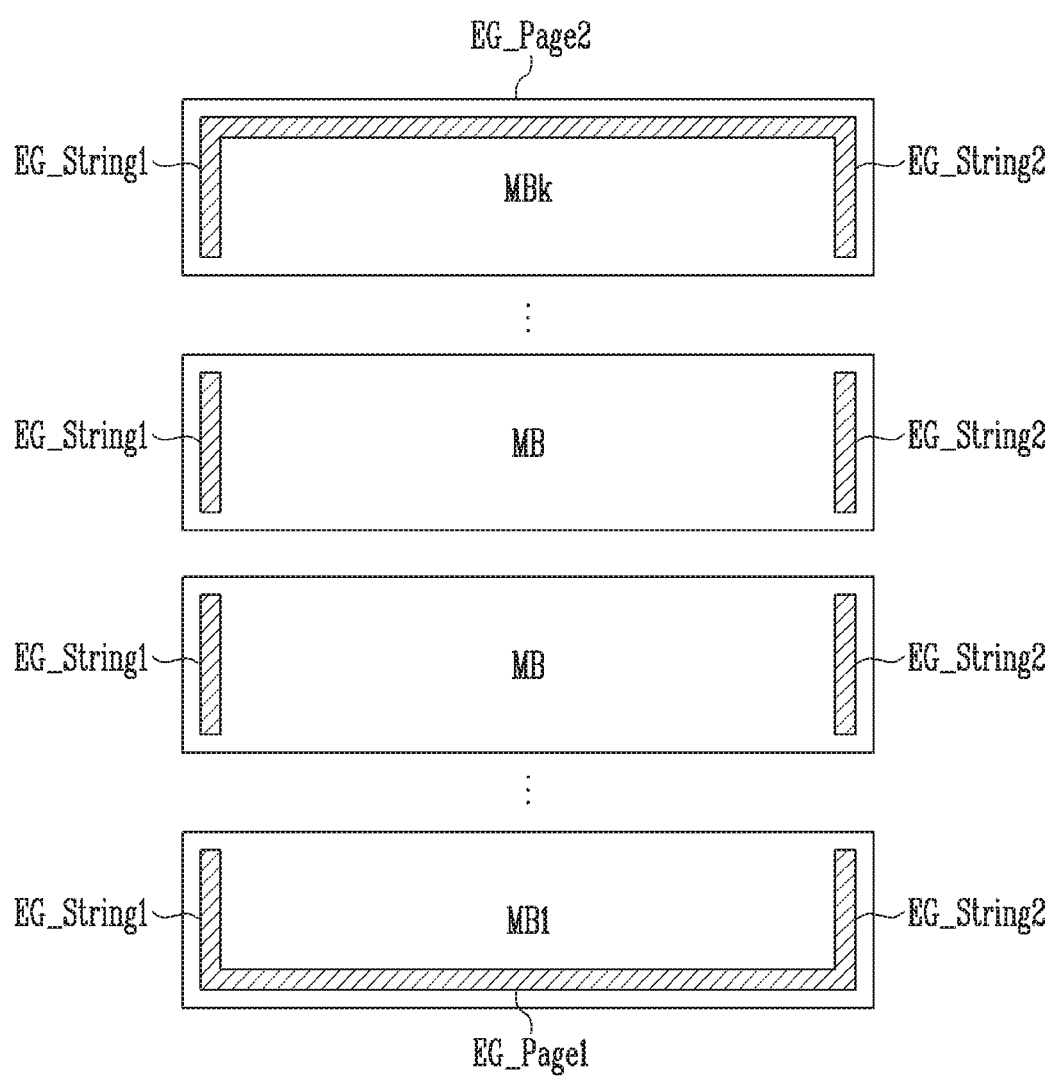
FIG. 7 is a diagram illustrating an edge page and an edge memory string of the memory cell array.

FIG. 7 is a diagram illustrating an edge page and an edge memory string of the memory cell array.

The operating method of the memory device according to the an embodiment of the present disclosure will be described as follows with reference to FIGS. 1 to 3, 6, and 7.

Edge pages EG_Page1 and EG_Page2 and edge memory strings EG_String1 and EG_String2, which are disposed in an edge area of the memory cell array 100 among a plurality of pages Page and a plurality of memory strings String, which are included in the plurality of memory blocks MB1 to MBk 110 included in the memory cell array 100, may be set as a dummy area (S610).

For example, as illustrated in FIG. 7, an edge page EG_Page1 disposed at an outermost portion among pages of a memory block MB1 disposed at an outermost portion among the plurality of memory blocks MB1 to MBk, an edge page EG_Page2 disposed at an outermost portion among pages of a memory block MBk disposed at an outermost portion among the plurality of memory blocks MB1 to MBk, and edge memory strings EG_String1 and EG_String2 disposed at an outermost portion among a plurality of memory strings included in each of the plurality of memory blocks MB1 to MBk may be set as a dummy area. Therefore, pages and memory strings, which are disposed in the edge area of the memory cell array 100 may be set as a dummy area. The operation of setting the edge pages EG_Page1 and EG_Page2 and the edge memory strings EG_String1 and EG_String2 as the dummy area may be performed under the control of the memory controller 1200 or be performed by the control logic 300 of the memory device 1100.

The memory device 1100 may perform a dummy program operation on the edge pages EG_Page1 and EG_Page2 and the edge memory strings EG_String1 and EG_String2, which are set as the dummy area (S620).

The dummy program operation may be an operation of programming the same dummy data in memory cells included in the edge pages EG_Page1 and EG_Page2 and the edge memory strings EG_String1 and EG_String2, which are set as the dummy area. For example, the dummy program operation may be an operation of programming the memory cells to have a threshold voltage higher than 0 volts (V).

The dummy program operation on the edge pages EG_Page1 and EG_Page2 may be performed in units of pages.

The dummy program operation on the edge memory strings EG_String1 and EG_String2 may be performed in units of pages. In the dummy program operation, a program inhibit voltage (e.g., a power voltage) may be applied to bit lines coupled to the other memory strings String except the edge memory strings EG_String1 and EG_String2, so that the dummy data can be prevented from being programmed in the other memory strings String.

After the dummy program operation on the dummy area is performed, a general operation such as a program operation or read operation may be performed on the other areas except the dummy area of the plurality of memory blocks MB1 to MBk (S630).

As described above, according to an embodiment of the present disclosure, the edge pages EG_Page1 and EG_Page2 and the edge memory strings EG_String1 and EG_String2, which are disposed in the edge area of the memory cell array 100, may be set as the dummy area, thereby performing the dummy program operation. Memory cells disposed in the dummy area may have a negative polarity, and hence mobile ions (e.g., $Na^+$) may be gathered to the memory cells. In addition, the dummy area might not be set in units of blocks but may be set in units of pages and memory strings, so that the setting range of the dummy area can be minimized.

Mobile ions may be gathered in the memory cells disposed in the dummy area in which the dummy data is programmed, and hence the threshold voltage distribution of the memory cells may be reduced. Therefore, the memory cells disposed in the dummy area may be reprogrammed by re-performing the step S620 after the step S630 is performed for a certain time or after a program/read operation is performed a certain number of times.

Figure 8:
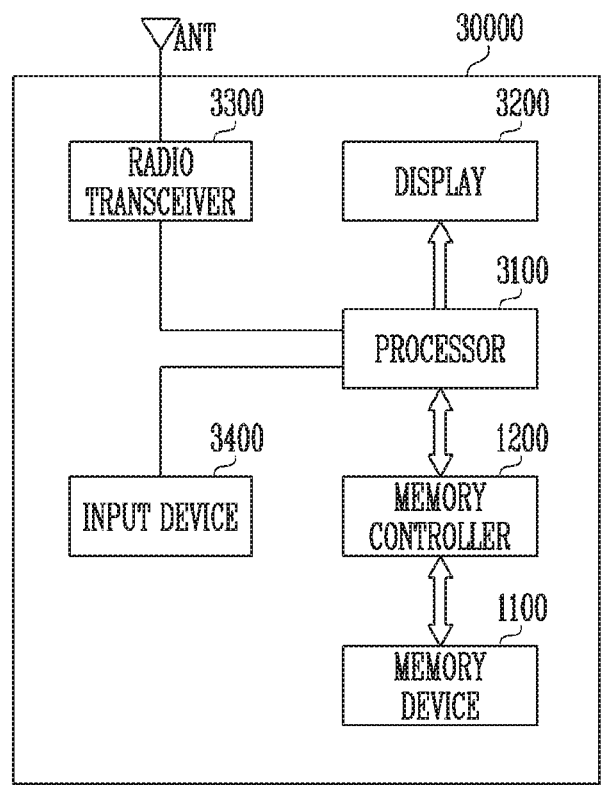
FIG. 8 is a diagram illustrating an embodiment of the memory system including the memory device of FIG. 2.

FIG. 8 is a diagram illustrating an embodiment of the memory system including the memory device of FIG. 2.

Referring to FIG. 8, the memory system 30000 may be implemented as a cellular phone, a smart phone, a tablet PC, a personal digital assistant (PDA), a wireless communication device, etc. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may convert a signal output from the processor 3100 into a radio signal, and output the converted radio signal to an external device through the antenna ANT. An input device 3400 may be a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the memory controller shown in FIG. 1, and the memory device 1100 may be implemented with the memory device shown in FIG. 2.

Figure 9:
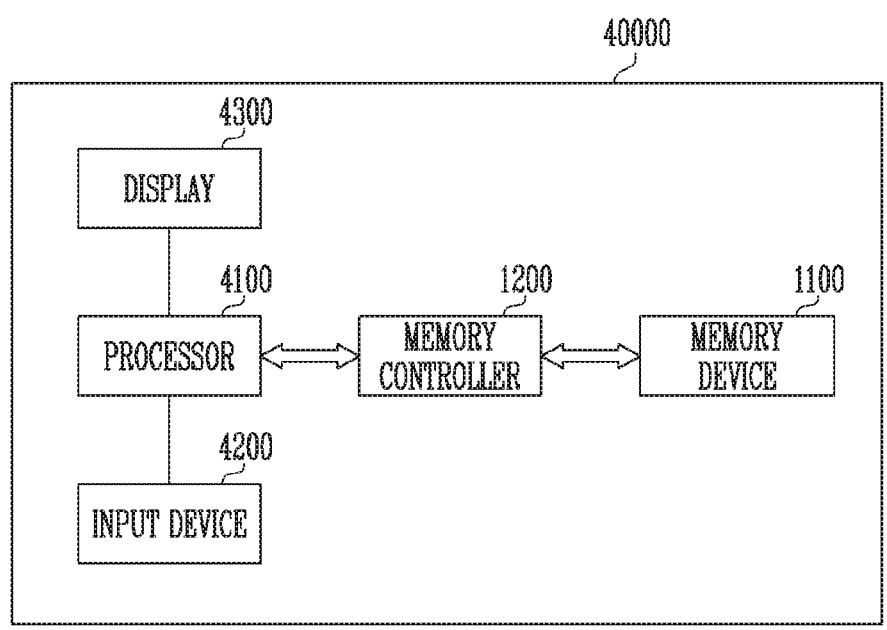
FIG. 9 is a diagram illustrating an embodiment of the memory system including the memory device of FIG. 2.

FIG. 9 is a diagram illustrating an embodiment of the memory system including the memory device of FIG. 2.

Referring to FIG. 9, the memory system 40000 may be implemented as a personal computer (PC), a tablet PC, a net-book, an e-reader, a personal digital assistant (PDA), a portable multi-media player (PMP), an MP3 player, an MP4 player, etc.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the memory controller shown in FIG. 1, and the memory device 1100 may be implemented with the memory device shown in FIG. 2.

Figure 10:
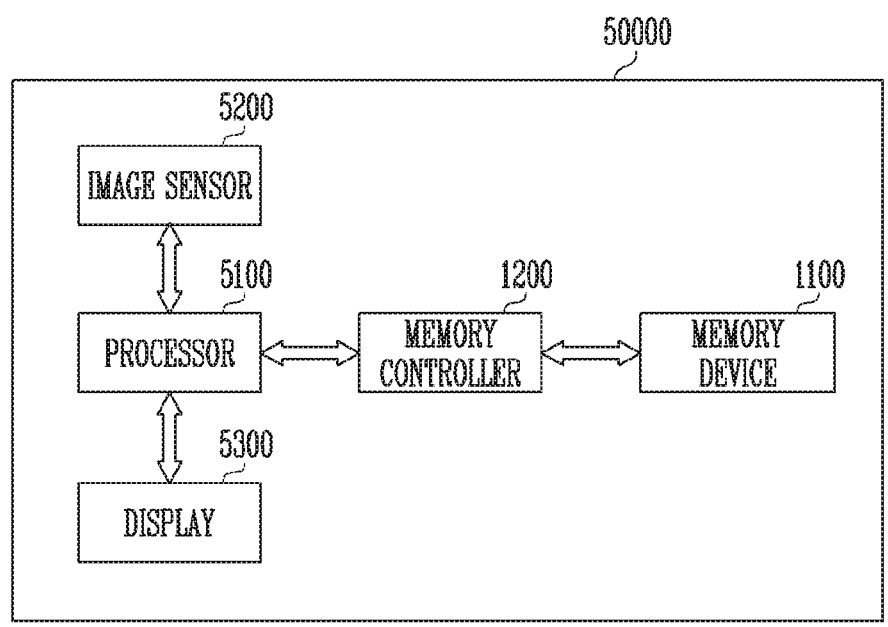
FIG. 10 is a diagram illustrating an embodiment of the memory system including the memory device of FIG. 2.

FIG. 10 is a diagram illustrating an embodiment of the memory system including the memory device of FIG. 2.

Referring to FIG. 10, the memory system 50000 may be implemented as an image processing device, e.g., a digital camera, a mobile terminal having a digital camera attached thereto, a smart phone having a digital camera attached thereto, a tablet PC having a digital camera attached thereto, etc.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor

5100. Also, the memory controller 1200 may be implemented with the memory controller shown in FIG. 1, and the memory device 1100 may be implemented with the memory device shown in FIG. 2.

Figure 11:
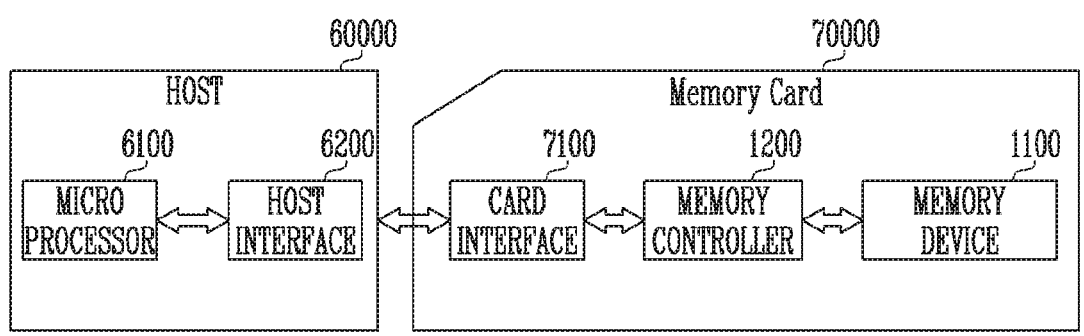
FIG. 11 is a diagram illustrating an embodiment of the memory system including the memory device of FIG. 2.

FIG. 11 is a diagram illustrating an embodiment of the memory system including the memory device of FIG. 2.

Referring to FIG. 11, the memory system 70000 may be implemented as a memory card, a smart card, etc. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100. In addition, the memory controller 1200 may be implemented with the memory controller shown in FIG. 1, and the memory device 1100 may be implemented with the memory device shown in FIG. 2.

According to the present disclosure, the memory device can prevent degradation of retention characteristics due to mobile ions, using memory blocks disposed at an outer edge of the memory cell array as a dummy block.

The examples of embodiments of the present disclosure have been described in the drawings and specification. Although specific terminologies are used here, those are only to explain the described embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the described embodiments disclosed herein.

So far as not being differently defined, all terms used herein including technical or scientific terminologies have meanings that are commonly understood by those skilled in the art to which the present disclosure pertains. The terms having definitions as defined in a dictionary should be understood such that they have meanings consistent with the context of the related technique. So far as not being clearly defined in this application, terms should not be understood in an ideally or excessively formal way.

What is claimed is:

1. A memory device comprising:
   a memory cell array including a plurality of memory blocks;
   a peripheral circuit configured to perform a dummy program operation on dummy blocks among the plurality of memory blocks of the memory cell array; and
   a control logic configured to control the peripheral circuit to program dummy data in the dummy blocks in the dummy program operation,
   wherein the peripheral circuit is configured to perform a program operation and a read operation on the memory cell array, and
   wherein the control logic controls the peripheral circuit to perform a reprogram operation on the dummy blocks after the program operation and the read operation are performed a set number of times.

2. The memory device of claim 1,
   wherein the control logic controlling the peripheral circuit includes performing the dummy program operation by selecting the dummy blocks from among the plurality of memory blocks.

3. The memory device of claim 2,
   wherein the peripheral circuit is configured to perform the program operation and the read operation on the memory cell array, and
   wherein the control logic controls the peripheral circuit to perform the reprogram operation on the dummy blocks after a certain time from when the program operation and the read operation are performed.

4. The memory device of claim 1, wherein the peripheral circuit programs all memory cells included in the dummy blocks to have a threshold voltage higher than 0 volts (V) in the dummy program operation.

5. The memory device of claim 1, wherein the dummy blocks are memory blocks disposed at an outermost portion of the memory cell array among the plurality of memory blocks.

6. The memory device of claim 1, wherein the dummy blocks are a memory block disposed firstly and a memory block disposed lastly among the plurality of memory blocks sequentially disposed in one direction.

7. The memory device of claim 1, wherein the dummy blocks are memory blocks disposed at an outermost portion among the plurality of memory blocks arranged in a matrix structure.

8. A memory device comprising:
   a memory cell array including a plurality of memory blocks;
   a peripheral circuit configured to perform a dummy program operation to store dummy data to memory cells of edge pages and edge memory strings included in the plurality of memory blocks; and
   a control logic configured to control the peripheral circuit to perform a normal program operation or a normal read operation on memory cells other than the memory cells of edge pages and edge memory strings after the dummy program operation,
   wherein the edge pages and the edge memory strings are disposed at an outermost portion of the memory cell array,
   wherein the peripheral circuit performs a reprogram operation to store the dummy data to the memory cells of the edge pages and the edge memory strings after a predetermine time from the dummy program operation.

9. The memory device of claim 8, wherein the peripheral circuit programs dummy data in memory cells disposed in the dummy area defined by the edge pages and the edge memory strings in the dummy program operation.

10. The memory device of claim 8, wherein the peripheral circuit programs memory cells disposed in the dummy area to have a threshold voltage higher than 0 volts (V) in the dummy program operation.

11. A method for operating a memory device, the method comprising:
- providing a memory device including a plurality of memory blocks;
- selecting memory blocks disposed at an outermost portion among the plurality of memory blocks as dummy blocks;
- performing a dummy program operation on the dummy blocks;
- performing a program operation and a read operation on the other memory blocks except the dummy blocks among the plurality of memory blocks; and
- performing a reprogram operation on the dummy blocks.

12. The method of claim 11, wherein, in the dummy program operation, dummy data is programmed in all memory cells included in the dummy blocks.

13. The method of claim 11, wherein, in the dummy program operation, all memory cells included in the dummy memory blocks are programmed to have a threshold voltage higher than 0 volts (V).

14. The method of claim 11,
- wherein the reprogram operation on the dummy blocks is performed after a certain time from when the program operation and the read operation on the other memory blocks are performed.

15. The method of claim 11,
- wherein the reprogram operation on the dummy blocks is performed after the program operation and the read operation on the other memory blocks are performed a set number of times.

* * * * *